(12) United States Patent
Chow et al.

(10) Patent No.: US 7,863,732 B2
(45) Date of Patent: Jan. 4, 2011

(54) BALL GRID ARRAY PACKAGE SYSTEM

(75) Inventors: Seng Guan Chow, Singapore (SG); Lionel Chien Hui Tay, Singapore (SG)

(73) Assignee: Stats Chippac Ltd., Singapore (SG)

( * ) Notice: Subject to any disclaimer, the term of this patent is extended or adjusted under 35 U.S.C. 154(b) by 197 days.

(21) Appl. No.: 12/050,400

(22) Filed: Mar. 18, 2008

(65) Prior Publication Data

US 2009/0236733 A1 Sep. 24, 2009

(51) Int. Cl.
*H01L 23/10* (2006.01)
*H01L 21/00* (2006.01)

(52) U.S. Cl. .................. 257/706; 257/707; 257/711; 257/720; 438/121; 438/122; 438/125

(58) Field of Classification Search ................. 257/720, 257/710, 711, 706, 707; 438/122, 121, 125
See application file for complete search history.

(56) References Cited

U.S. PATENT DOCUMENTS

| | | | |
|---|---|---|---|
| 5,430,611 A | 7/1995 | Patel et al. | |
| 5,477,082 A | 12/1995 | Buckley, III et al. | |
| 6,442,026 B2 | 8/2002 | Yamaoka | |
| 6,501,164 B1 | 12/2002 | Chen et al. | |
| 6,537,848 B2 | 3/2003 | Camenforte et al. | |
| 6,678,167 B1 | 1/2004 | Degani et al. | |
| 6,683,795 B1 | 1/2004 | Yoo | |
| 6,809,937 B2 | 10/2004 | Augustin et al. | |
| 6,853,070 B2 | 2/2005 | Khan et al. | |
| 6,984,785 B1 | 1/2006 | Diao et al. | |
| 7,241,645 B2 | 7/2007 | Zhao et al. | |
| 7,315,078 B2 | 1/2008 | Huang | |
| 7,315,079 B2 | 1/2008 | Zhou et al. | |
| 7,462,933 B2 * | 12/2008 | Zhao et al. | 257/713 |
| 7,495,321 B2 | 2/2009 | Do et al. | |
| 7,566,590 B2 * | 7/2009 | Zhong et al. | 438/119 |
| 2005/0277227 A1 * | 12/2005 | Shim et al. | 438/108 |
| 2006/0103010 A1 * | 5/2006 | Kim et al. | 257/706 |

* cited by examiner

*Primary Examiner*—Long K Tran
(74) *Attorney, Agent, or Firm*—Mikio Ishimaru

(57) ABSTRACT

A ball grid array package system comprising: forming a package base including: fabricating a heat spreader having an access port, attaching an integrated circuit die to the heat spreader, mounting a substrate around the integrated circuit die, and coupling an electrical interconnect between the integrated circuit die and the substrate; and coupling a second integrated circuit package to the substrate through the access port.

20 Claims, 3 Drawing Sheets

BALL GRID ARRAY PACKAGE SYSTEM

TECHNICAL FIELD

The present invention relates generally to integrated circuit packaging, and more particularly to a system for enhancing the capabilities of ball grid array packaging.

BACKGROUND ART

A number of different packaging technologies exist for attaching semiconductor devices to a printed circuit board (PCB). Many of today's consumer electronic devices, such as personal video players, video games and hand held computers require a high density of integrated circuits mounted on the PCB. The three packaging technologies include a ball grid array (BGA), chip scale package (CSP), and direct chip attach (DCA). BGA is an older technology relative to CSP and DCA. Theoretically speaking, the most effective packaging technology is DCA. DCA involves the direct attachment of the chip to the PCB without a package, such as a solder-bumped flip chip or wire bonding chip on the board. Issues with respect to the cost of supplying a known good die (KGD) and corresponding fine line and spacing PCB are present. As a result, CSP's and BGA's are the main types of packaging technology used in attaching semiconductors to PCB's.

As the demand for high speed, high performance, and low cost, semiconductor devices are continually increasing in integration density, packages have become more complex. For example, packages are present in which multiple chips are placed within a single package. These types of chips are also referred to as multi-chip modules. A multi-chip module (MCM), also referred to as a multi-chip package (MCP), contains two or more die in a single package. These multi-chip modules may contain microprocessor circuits along with peripheral circuits, such as memory management units, input/output controllers, peripheral component interconnect or interface (PCI) controllers, and application specific integrated circuits (ASIC).

The most common MCM is a "side-by-side" MCM. In this type of MCM, two or more die are mounted next to each other on the mounting surface of either a plastic molded package, cavity package, or a chip on board (COB) assembly. The die may be mounted directly to the mounting surface or be mounted on a substrate, which is itself mounted to the principle-mounting surface. Inner connections among these die and electrical leads are commonly made via wire bonding. Other MCM's involve placing two or more die on top of each other and securing the "stack" of die in a package.

One problem with placing multiple die within a single package is with additional die, additional possible defects are possible within the package. If one die within an MCM is defective, the entire chip must then be discarded. Thus, although MCM's have provided increased functionality, yields have decreased as a result of the increased chances for defects.

Thus, a need still remains for a ball grid array package system. In view of the increasing demand for more circuit function in limited space, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a ball grid array package system including: forming a package base by: fabricating a heat spreader having an access port, attaching an integrated circuit die to the heat spreader, mounting a substrate around the integrated circuit die, and coupling an electrical interconnect between the integrated circuit die and the substrate; and coupling a second integrated circuit package to the substrate through the access port.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
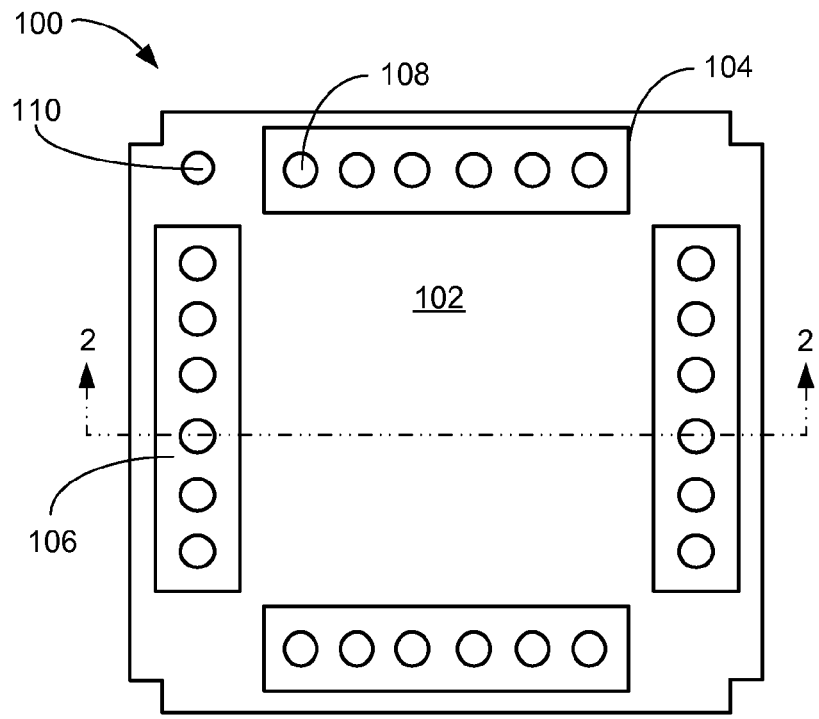
FIG. 1 is a top view of a ball grid array package system, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the heat sink, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a top view of a ball grid array package system 100, in an embodiment of the present invention. The top view of the ball grid array package system 100 depicts a heat spreader 102, such as an electrically and thermally conductive material, having an access port 104. A substrate 106, such as a laminate substrate, a thin film substrate, a flex circuit substrate, or the like, may be positioned beneath the heat spreader 102 to align a connection pad 108 within the access port 104. A pin one indicator 110 may be used for optical alignment during assembly of the next level system (not shown). A section line 2-2 shows the position and direction of view for FIG. 2.

The position and number of the access port 104 is by way of an example only. The actual number, size, position and shape may differ. The heat spreader 102 may be electrically connected to the reference voltage for the ball grid array package system 100. In this configuration, the heat spreader 102 may act as an electromagnetic interference (EMI) shield. The heat spreader 102 may act as a stiffener, for thin packaged ball grid arrays, in order to maintain co-planarity and prevent warping of the package.

Figure 2:
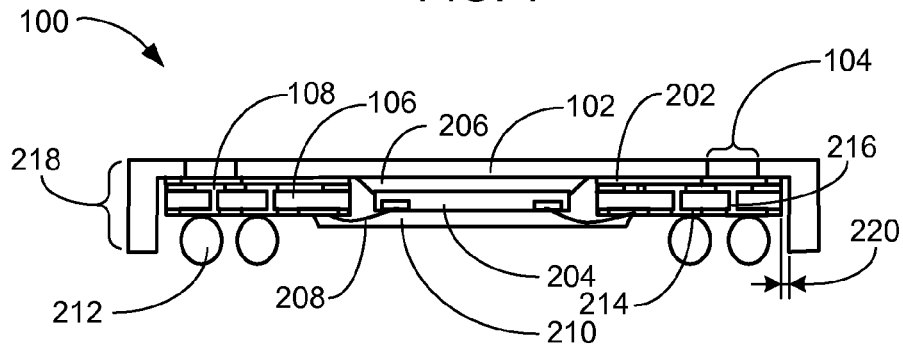
FIG. 2 is a cross-sectional view of the ball grid array package system, of FIG. 1, along the section line 2-2.

Referring now to FIG. 2, therein is shown a cross-sectional view of the ball grid array package system 100, of FIG. 1, along the section line 2-2. The cross-sectional view of the ball grid array package system 100 depicts the heat spreader 102 having the substrate 106 attached by an insulating adhesive 202, such as a thermally conductive and electrically isolating adhesive. The connection pad 108 may be positioned in the access port 104 for further connection. An integrated circuit die 204 may be mounted to the heat spreader 102 by a conductive adhesive 206, such as a die attach material. The conductive adhesive 206 may be both thermally and electrically conductive to form a reference voltage connection, such as ground connection, between the integrated circuit die 204 and the heat spreader 102.

An electrical interconnect 208, such as a bond wire, may couple the integrated circuit die 204 to the substrate 106. A molded cap 210, such as an epoxy molded cap, may be formed on the integrated circuit die 204, the substrate 106, and the electrical interconnect 208. A system interconnect 212, such as a solder ball, solder bump, solder column, or stud bump, may be coupled to a system pad 214 on the bottom of the substrate 106. A via 216 may couple the system pad 214 to the connection pad 108. The heat spreader 102 may include standoff legs 218 that may be used to control the collapse height of the system interconnect 212 during the assembly reflow process.

The number and position of the system interconnect 212 is by way of an example only. The actual number and position of the system interconnect 212 may differ. A gap 220 may be provided between the standoff legs 218 and the substrate 106 in order to prevent possible short circuits.

Figure 3:
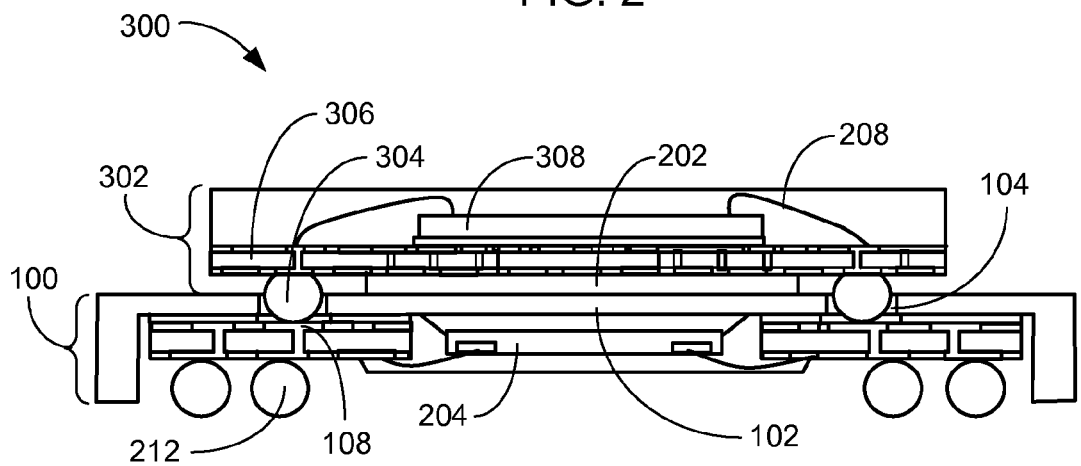
FIG. 3 is a cross-sectional view of a package stack, in an embodiment of the present invention.

Referring now to FIG. 3, therein is shown a cross-sectional view of a package stack 300, in an embodiment of the present invention. The cross-sectional view of the package stack 300 depicts the ball grid array package system 100 having a second integrated circuit package 302, such as a ball grid array package, coupled to the access port 104. A chip interconnect 304, such as a solder ball, solder column, solder bump, or stud bump, may couple a second substrate 306, of the second integrated circuit package 302, to the connection pad 108. A second integrated circuit die 308 may be mounted on the second substrate 306 by the conductive adhesive 206, such as die attach material. The electrical interconnect 208 may form an electrical connection between the second integrated circuit die 308 and the chip interconnect 304.

By mounting the second integrated circuit package 302 through the access port 104, an electrical path may be formed between the integrated circuit die 204, the second integrated circuit die 308, the system interconnect 212, or a combination thereof. The access port 104 provides sufficient clearance around the chip interconnect 304 to prevent an electrical connection from being formed to the heat spreader 102 during the reflow attachment process.

The number and position of the chip interconnect 304 is an example only. The actual number and position of the chip interconnect 304 may be different. Optionally, the insulating adhesive 202 may be applied between the heat spreader 102 and the second substrate 306 to provide a thermal path for the second integrated circuit package 302.

Figure 4:
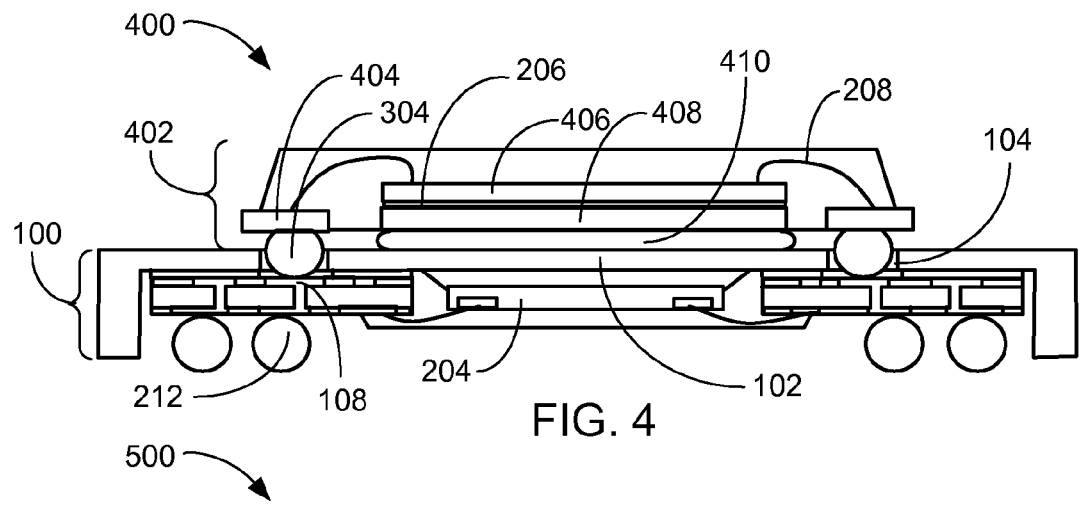
FIG. 4 is a cross-sectional view of a package stack, in an alternative embodiment of the present invention.

Referring now to FIG. 4, therein is shown a cross-sectional view of a package stack 400, in an alternative embodiment of the present invention. The cross-sectional view of the package stack 400 depicts the ball grid array package system 100 having a second integrated circuit package 402, such as a quad flat pack no-lead package, coupled to the access port 104. The chip interconnect 304, such as a solder ball, solder column, solder bump, or stud bump, may couple a no-lead contact 404, of the second integrated circuit package 402, to the connection pad 108. A second integrated circuit die 406 may be mounted on a die paddle 408 by the conductive adhesive 206, such as die attach material. The electrical interconnect 208 may form an electrical connection between the second integrated circuit die 406 and the chip interconnect 304.

By mounting the second integrated circuit package 402 through the access port 104, an electrical path may be formed between the integrated circuit die 204, the second integrated circuit die 406, the system interconnect 212, or a combination thereof. The access port 104 provides sufficient clearance around the chip interconnect 304 to prevent an electrical connection from being formed to the heat spreader 102 during the reflow attachment process.

The number and position of the chip interconnect 304 is an example only. The actual number and position of the chip interconnect 304 may be different. An adhesive 410, such as a solder paste, may be applied between the heat spreader 102 and the die paddle 408 to provide a thermal path and voltage reference for the second integrated circuit package 402.

Figure 5:
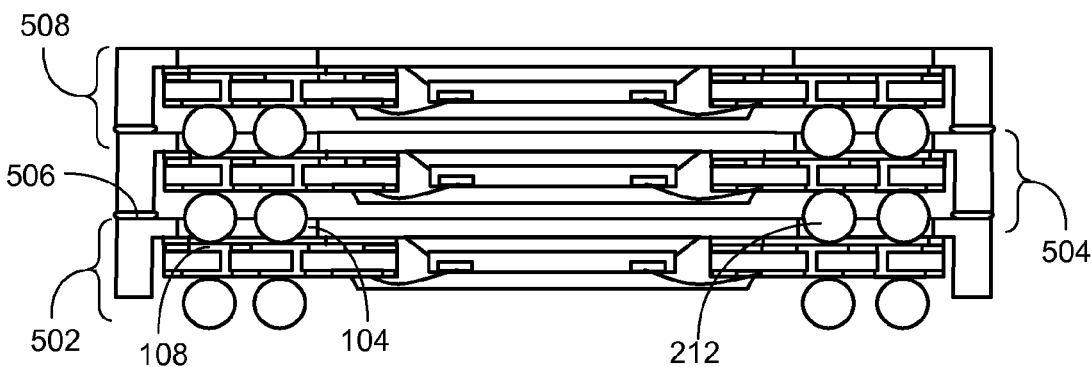
FIG. 5 is a cross-sectional view of a package stack, in another alternative embodiment of the present invention.

Referring now to FIG. 5, therein is shown a cross-sectional view of a package stack 500, in another alternative embodiment of the present invention. The cross-sectional view of the package stack 500 depicts a first package base 502 formed of the ball grid array package system 100, of FIG. 1. The first package base 502 may provide the heat spreader 102 having the access port 104 of sufficient width to allow two or more of the system interconnect 212 to contact the corresponding number of the connection pad 108.

A second package base 504 may be mounted on the first package base 502 and electrically connected through the access port 104. A conductive coupler 506, such as solder paste, conductive epoxy, or the like, may provide an electrical connection between the heat spreader 102 of the first package base 502 and the heat spreader 102 of the second package base 504.

A third package base 508 may be mounted on the second package base 504 in a substantially similar connection process. It is understood that the configuration of the access port 104 of the first package base 502 may be different from the access port 104 configuration of the second package base 504. In order to assemble the package stack 500, the system interconnect 212 of the second package base 504 must align with the access port 104, having the connection pad 108, of the first package base 502.

It has been discovered that the ability to stack different configurations of the ball grid array package system 100, may provide a high performance system in package (SIP) that may reliably operate in higher temperature ambient environments due to the heat flow path provided by the heat spreader 102 of the first package base 502 being coupled to the heat spreader 102 of the second package base 504, and so on. It is further understood that the upper most unit of the ball grid array package system 100, having the access port 104, may provide a connection platform for coupling additional packages, discrete components, integrated circuit die, an external heat sink, or a combination thereof.

Figure 6:
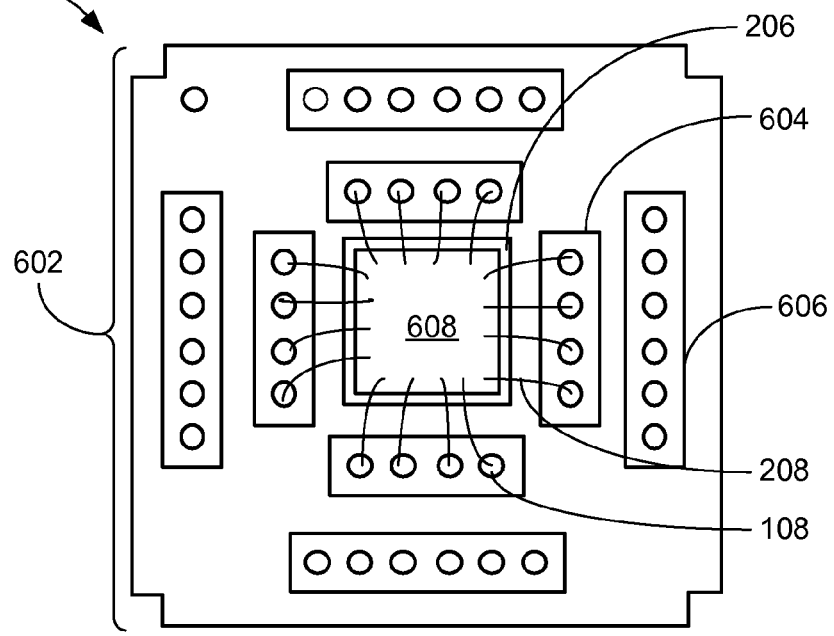
FIG. 6 is a top view of a ball grid array package system, in an alternative embodiment of the present invention.

Referring now to FIG. 6, therein is shown a top view of a ball grid array package system 600, in an alternative embodiment of the present invention. The top view of the ball grid array package system 600 depicts a package base 602 having an inner access port 604 and an outer access port 606. A second integrated circuit die 608 may be mounted on the heat spreader 102 by the conductive adhesive 206, such as a die attach material. The electrical interconnect 208 may couple the second integrated circuit die 608 to the connection pad 108 through the inner access port 604. It is understood that the second integrated circuit die 608 may be a flip chip type and could be coupled by the chip interconnect 304, of FIG. 3, through the inner access port 604.

The number and position of the connection pads 108 in the inner access port 604 is an example only and the actual number and position may differ. The second integrated circuit die 608 may optionally be covered by the molded cap 210, a glob top (not shown), or the like.

The outer access port 606 may be available for coupling additional units of the package base 602, the second integrated circuit package 302, the external heat sink (not shown), discrete components (not shown), or a combination thereof. It is further understood that the position, size, shape, and number of the connection pads 108 shown in the outer access port is an example only and the actual position, size, shape, and number of the connection pads 108 may differ.

Figure 7:
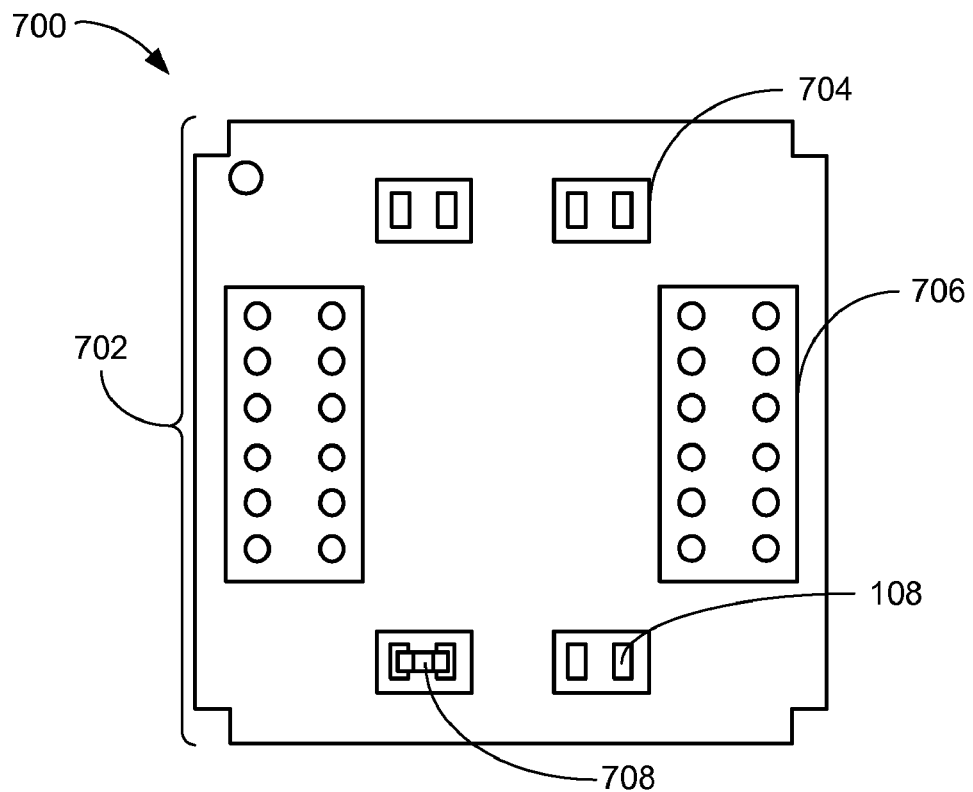
FIG. 7 is a top view of a ball grid array package system, in another alternative embodiment of the present invention.

Referring now to FIG. 7, therein is shown a top view of a ball grid array package system 700, in another alternative embodiment of the present invention. The top view of the ball grid array package system 700 depicts a package base 702 having a component access port 704 and a package access port 706. The component access port 704 may allow coupling a discrete component 708, such as a resistor, a capacitor, an inductor, a diode, a voltage regulator, or the like.

It is understood that the number, size, and position of the component access port 704 is an example only and the actual number, size, and position of the component access port 704 may differ. It is also understood that the component access port 704 is shown as having a rectangular shape for the connection pad 108, but this is an example only and the actual shape may differ.

The package access port 706 may have multiple rows of the connection pad 108 and may provide any number of the connection pad 108. The position and number of the connection pad 108 present in the package access port 706 may correspond to the position and number of the system interconnect 212, of FIG. 2, on the external package intended to be the second integrated circuit package 302, of FIG. 3.

It has been discovered that the ball grid array package system 700, of the present invention, may provide the EMI shield between the package base 702 and the second integrated circuit package 302. The ball grid array package system 700 may also provide a flexible configuration capability, through the component access port 704, as well as a common reference voltage for all of the components mounted thereon.

Figure 8:
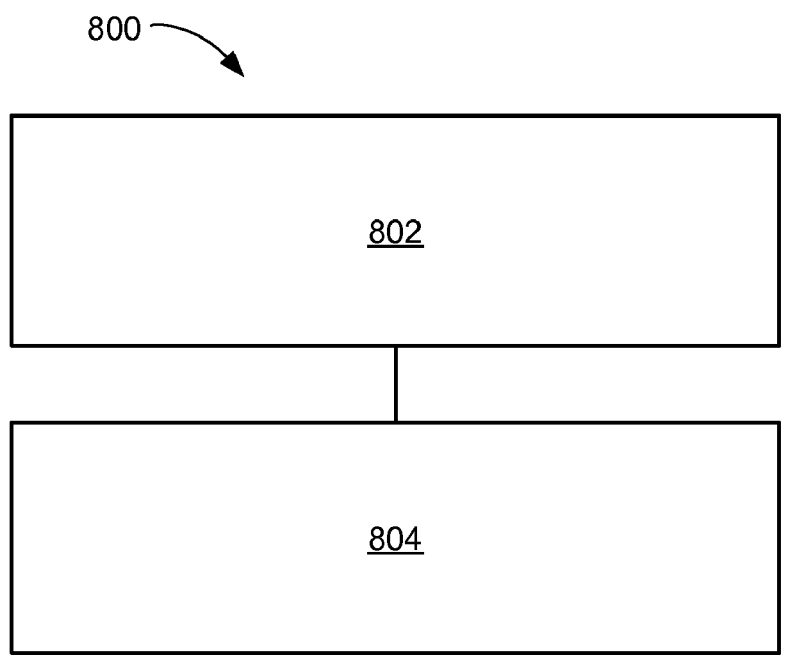
FIG. 8 is a flow chart of a ball grid array package system for manufacturing the ball grid array package system in an embodiment of the present invention.

Referring now to FIG. 8, therein is shown a flow chart of a ball grid array package system 800 for manufacturing the ball grid array package system in an embodiment of the present invention. The system 800 includes forming a package base including: fabricating a heat spreader having an access port, attaching an integrated circuit die to the heat spreader, mounting a substrate around the integrated circuit die, and coupling an electrical interconnect between the integrated circuit die and the substrate in a block 802; and coupling a second integrated circuit package to the substrate through the access port in a block 804.

It has been discovered that the present invention thus has numerous aspects.

An aspect that has been unexpectedly discovered is that the present invention is that the addition of the standoff legs on the heat spreader may prevent the complete collapse of the system interconnects during the reflow process and may also be used to couple a reference voltage through the heat spreaders in a package stack.

Another aspect is the heat spreaders coupled to the reference voltage may act as an EMI shield between the package base and a second integrated circuit package mounted thereon.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the ball grid array package system of the present invention furnishes important and heretofore unknown and unavailable solutions, capabilities, and functional aspects for stacking enhanced cavity down ball grid array packages. The resulting processes and configurations are straightforward, cost-effective, uncomplicated, highly versatile and effective, can be surprisingly and unobviously implemented by adapting known technologies, and are thus readily suited for efficiently and economically manufacturing stackable ball grid array package devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of making a ball grid array package system comprising:
    forming a package base including:
        fabricating a heat spreader having an access port including an inner access port, an outer access port, a component access port, a package access port, or a combination thereof,
        attaching an integrated circuit die to the heat spreader,
        mounting a substrate around the integrated circuit die using an insulating adhesive between the substrate and the heat spreader, and
        coupling an electrical interconnect between the integrated circuit die and the substrate; and
    coupling a second integrated circuit package to the substrate through the access port.

2. The method as claimed in claim 1 further comprising forming a package stack on the package base.

3. The method as claimed in claim 1 further comprising providing a component access port for coupling a discrete component to the substrate.

4. The method as claimed in claim 1 further comprising:
    applying a conductive adhesive on the package base;
    mounting a second integrated circuit die on the conductive adhesive; and
    coupling a chip interconnect between the second integrated circuit die and the substrate of the package base through the access port.

5. The method as claimed in claim 1 further comprising providing a standoff leg, on the heat spreader, for limiting a system interconnect collapse.

6. A method of making a ball grid array package system comprising:
    forming a package base including:
        fabricating a heat spreader having an access port including an inner access port, an outer access port, a component access port, a package access port, or a combination thereof,
        attaching an integrated circuit die to the heat spreader wherein attaching the integrated circuit die including mounting the integrated circuit die under the heat spreader,
        mounting a substrate around the integrated circuit die including applying an insulating adhesive between the substrate and the heat spreader, and
        coupling an electrical interconnect between the integrated circuit die and the substrate including forming a molding cap on the integrated circuit die, the electrical interconnect, and the substrate; and
    coupling a second integrated circuit package to the substrate through the access port including coupling a ball grid array package or a quad flat pack no-lead package.

7. The method as claimed in claim 6 further comprising forming a package stack on the package base including mounting a second package base, a third package base, the ball grid array package, the quad flat pack no-lead package, a discrete component, an external heat sink, or a combination thereof.

8. The method as claimed in claim 6 wherein providing the component access port for coupling a discrete component to the substrate including coupling a resistor, a capacitor, an inductor, a diode, or a voltage regulator through the component access port.

9. The method as claimed in claim 6 further comprising:
    applying a conductive adhesive on the package base including applying a solder paste on the heat spreader;
    mounting a second integrated circuit die on the conductive adhesive including mounting a wire bond die, or a flip chip die; and
    coupling a chip interconnect between the second integrated circuit die and the substrate of the package base including coupling a bond wire, a solder ball, or a combination thereof through the access port.

10. The method as claimed in claim 6 further comprising providing a standoff leg, on the heat spreader, for limiting a system interconnect collapse including applying a conductive coupler between the standoff leg of the package base and the standoff leg of the second package base.

11. A ball grid array package system comprising:
    a package base including:
        a heat spreader with an access port includes an inner access port, an outer access port, a component access port, a package access port, or a combination thereof in the heat spreader,
        an integrated circuit die attached to the heat spreader,
        a substrate mounted around the integrated circuit die,
        an insulating adhesive between the substrate and the spreader,
        an electrical interconnect between the integrated circuit die and the substrate; and
    a second integrated circuit package coupled to the substrate through the access port.

12. The system as claimed in claim 11 further comprising a package stack formed on the package base.

13. The system as claimed in claim 11 further comprising a component access port for coupling a discrete component to the substrate.

14. The system as claimed in claim 11 further comprising:
    a conductive adhesive on the package base;
    a second integrated circuit die on the conductive adhesive; and
    a chip interconnect coupled, through the access port, between the second integrated circuit die and the substrate of the package base.

15. The system as claimed in claim 11 further comprising a standoff leg, on the heat spreader, for limiting a system interconnect collapse.

16. The system as claimed in claim 11 further comprising:
    an insulating adhesive between the substrate and the heat spreader;
    a molding cap on the integrated circuit die, the electrical interconnect, and the substrate; and
    a ball grid array package or a quad flat pack no-lead package coupled through the access port.

17. The system as claimed in claim 16 further comprising a package stack formed on the package base includes a second package base, a third package base, the ball grid array package, the quad flat pack no-lead package, a discrete component, an external heat sink, or a combination thereof mounted over the package base.

18. The system as claimed in claim 16 wherein the component access port with a discrete component coupled to the substrate includes a resistor, a capacitor, an inductor, a diode, or a voltage regulator coupled through the component access port.

19. The system as claimed in claim 16 further comprising:
a conductive adhesive on the package base includes a solder paste on the heat spreader;
a second integrated circuit die on the conductive adhesive includes a wire bond die, or a flip chip die mounted thereon; and
a chip interconnect coupled, through the access port, between the second integrated circuit die and the substrate of the package base includes a bond wire, a solder ball, or a combination thereof coupled through the access port.

20. The system as claimed in claim 16 further comprising a standoff leg, on the heat spreader, for limiting a system interconnect collapse includes a conductive coupler between the standoff leg of the package base and the standoff leg of the second package base.

* * * * *